(12) United States Patent
Einav

(10) Patent No.: US 7,842,588 B2
(45) Date of Patent: Nov. 30, 2010

(54) GROUP-III METAL NITRIDE AND PREPARATION THEREOF

(75) Inventor: Moshe Einav, Kfar Uriyah (IL)

(73) Assignee: Mosaic Crystals, Herzeliya Pituach (IL)

( * ) Notice: Subject to any disclaimer, the term of this patent is extended or adjusted under 35 U.S.C. 154(b) by 0 days.

(21) Appl. No.: 12/528,042

(22) PCT Filed: Feb. 21, 2008

(86) PCT No.: PCT/IL2008/000229

§ 371 (c)(1),
(2), (4) Date: Feb. 8, 2010

(87) PCT Pub. No.: WO2008/102358

PCT Pub. Date: Aug. 28, 2008

(65) Prior Publication Data

US 2010/0136770 A1 Jun. 3, 2010

Related U.S. Application Data

(60) Provisional application No. 60/902,780, filed on Feb. 22, 2007.

(51) Int. Cl.
*H01L 21/20* (2006.01)
(52) U.S. Cl. .......... 438/486; 438/96; 438/483; 438/497; 257/E21.097; 257/E33.004
(58) Field of Classification Search .......... 438/96, 438/483, 486, 497; 423/384
See application file for complete search history.

(56) References Cited

U.S. PATENT DOCUMENTS 5,847,397 A * 12/1998 Moustakas ........... 250/370.06
5,976,398 A 11/1999 Yagi
7,078,731 B2 * 7/2006 D'Evelyn et al. .......... 257/94
2002/0100910 A1 8/2002 Kordesch (Continued)

OTHER PUBLICATIONS

Kondo et al. "Fabrication of GaN dot structures on Si substrates by droplet epitaxy." *Phys. Stats. Sol. A.* vol. 203. No. 7. 2006. pp. 1700-1703.

(Continued)

*Primary Examiner*—Alexander G Ghyka
(74) *Attorney, Agent, or Firm*—Merchant & Gould P.C.

(57) ABSTRACT

A method for forming a group-III metal nitride material film attached to a substrate including subjecting the substrate to an ambient pressure of no greater than 0.01 Pa, and heating the substrate to a temperature of between approximately 500° C.-800° C. The method further includes introducing a group III metal vapor to the surface of the substrate at a base pressure of at least 0.01 Pa, until a plurality of group III metal drops form on the surface, and introducing active nitrogen to the surface at a working pressure of between 0.05 Pa and 2.5 Pa, until group III metal nitride molecules form on the group III metal drops. The method also includes maintaining the working pressure and the active nitrogen until the group III metal nitride molecules diffuse into the group III metal drops, forming nitride/metal solution drops, and until the nitride/metal solution drops turn into a wetting layer on the substrate, and continuing to increase the concentration of group III metal nitride molecules in the wetting layer until all the group III metal atoms contained in the wetting layer are exhausted, and the wetting layer transforms into a group III metal nitride film.

16 Claims, 6 Drawing Sheets

U.S. PATENT DOCUMENTS

| | | | | |
|---|---|---|---|---|
| 2007/0158785 | A1* | 7/2007 | D'Evelyn et al. | 257/615 |
| 2007/0212803 | A1* | 9/2007 | Shibata | 438/22 |
| 2007/0254458 | A1* | 11/2007 | Bour et al. | 438/479 |
| 2008/0282967 | A1* | 11/2008 | Einav | 117/1 |
| 2009/0081109 | A1* | 3/2009 | Einav | 423/409 |
| 2010/0015787 | A1* | 1/2010 | Yu et al. | 438/483 |

OTHER PUBLICATIONS

Nagata et al. "Low-temperature growth of GaN microcrystals from position-controlled Ga droplets arrayed by a low-energy focused ion beam system." *J. Of Crystal Growth. vol.* 283. 2005. pp. 328-331.

Chang et al. "Photocurrent studies of the carrier escape process from InAs self-assembled quantum dots." *Physical Review B. vol.* 62. *No.* 11. 2000. pp. 6959-6992.

Kim et al. "Near room temperature droplet epitxay for fibration of InAs quantum dots." *Applied Physics Letters. Vol.* 85. *No.* 24. 2004. pp. 5893-5895.

Lanke et al. "Effect of Ion-Energy of the properties of amorphous GaN films produced by ion-assisted deposition." *Modern Physics Letters B. vol.* 15. *Nos.* 28 & 29. 2001. pp. 1355-1360.

* cited by examiner

GROUP-III METAL NITRIDE AND PREPARATION THEREOF

This application is a National Stage Application of PCT/IL2008/000229, filed 21 Feb. 2008, which claims benefit of U.S. Ser. No. 60/902,780, filed 22 Feb. 2007 and which applications are incorporated herein by reference. To the extent appropriate, a claim of priority is made to each of the above disclosed applications.

FIELD OF THE DISCLOSED TECHNIQUE

The disclosed technique relates to group-III metal nitride, in general, and to preparation of a group-III metal nitride film, in particular.

BACKGROUND OF THE DISCLOSED TECHNIQUE

An amorphous material is a solid in which the atoms exhibit no long range order and are bound to each other irregularly, as opposed to a crystalline material, which has a regular repeating internal structure. An example of an amorphous material is ordinary window glass, which is formed when molten silicate with high viscosity is cooled, without allowing a regular crystal lattice to form. The amorphous state of the glass results in various useful optical properties, such as its transparency. The presence of various contaminants and impurities may have a significant influence on the final properties of the amorphous material (e.g., its color, transparency, melting point).

Group-III metals of the periodic table (i.e., aluminum, gallium and indium) can form nitrides, i.e., aluminum nitride (AlN), gallium nitride (GaN) and indium nitride (InN). Group-III metal nitrides are semiconductors having various energy gaps (between two adjacent allowable bands), e.g., a narrow gap of 0.7 eV for InN, an intermediate gap of 3.4 eV for GaN, and a wide gap of 6.2 eV for AlN. Solid group-III metal nitrides have an ordered crystalline structure, giving them advantageous chemical and physical properties, such that electronic devices made from group-III metal nitrides can operate at conditions of high temperature, high power and high frequency. Electronic devices made from group-III metal nitrides may emit or absorb electromagnetic radiation having wavelengths ranging from the UV region to the IR region of the spectrum, which is particularly relevant for constructing light emitting diodes (LED), solid-state lights and the like.

To be used in various technological applications, the group-III metal nitride crystals may be in the form of a free-standing wafer or a thin film, attached to an arbitrary platform of conducting, semi conducting, or dielectric nature. For other uses, group III metal nitrides may be in the form of a free standing bulk crystal. For industrial applications, group III metal nitride crystals of large size (i.e., substantially 25 mm or larger) are required. However, crystals of large size, having a low defect density, are difficult to manufacture.

Group-III metal nitride crystals are not found naturally and are artificially produced as thin films on a crystalline substrate, by methods known in the art. Among the group III metal nitrides, gallium nitride can be produced using hetero epitaxy, wherein the substrate used as a hetero epitaxial template can be, for example, a single crystalline wafer of sapphire ($Al_2O_3$), on which a layer of GaN is deposited. Alternatively, a silicon carbide (SiC) wafer may be used as a substrate. However, due to the difference in lattice parameters between the substrate and the GaN layer, various crystal defects may appear in the GaN crystal.

Other known methods for growing group-III metal nitride crystals employ a metallic melt, typically of the group-III metal. Nitrogen is supplied to the melt and chemically reacts with the group III metal in the melt, thereby enabling crystal growth. Such methods are often expensive, and the crystal dimensions achieved, as well as the quantity of crystals produced, are typically small for industrial applications. Group-III metal nitride crystals, manufactured according to methods known in the art usually have crystal defects therein, such as dislocations, misorientations, vacancies, interstitial atoms, impurities, and grain boundaries. In particular, none of the above mentioned methods are used to produce GaN crystal sheets of large dimensions, having a low defect density of less than $10^3$ defects per centimeter squared.

Amorphous group-III metal nitrides have certain useful optical properties, making them possible candidates for a variety of applications, such as solar batteries and full color displays.

Techniques for preparation of material films include: thin-film deposition processes (e.g., sputter deposition and chemical vapor deposition), Molecular Beam Epitaxy (MBE), and ion implantation. Thin-film deposition involves depositing a thin film onto a substrate, or on previously deposited layers on the substrate.

MBE is a method for epitaxially growing layers of materials onto a substrate, by slowly directing a beam of particles toward the surface of the substrate. MBE generally requires a high vacuum in the reaction chamber, in order to avoid impurities in the epitaxially formed material. The epitaxy deposition rate in MBE is considered slow, relative to other deposition techniques.

Sputter deposition is one type of thin film deposition technique. The atoms in a solid target material are ejected into a gas phase by ion bombardment. Each collision knocks off additional atoms, where the number of ejected atoms per incident ion (i.e., the sputter yield) is dependent on several factors, such as the energy of the incident ions, the respective masses of the ions and atoms, and the binding energy of the atoms in the solid. The ions are provided by a plasma, usually of a noble gas (e.g., argon). The ejected atoms are not in their thermodynamic equilibrium state, and tend to deposit on all surfaces in the vacuum chamber. Therefore a substrate in the chamber will end up being coated with a thin film having the same composition of the target material. The target can be kept at a relatively low temperature during sputter deposition, since no evaporation is involved. In reactive sputtering, the plasma gas includes a small amount of a non-noble gas, such as oxygen or nitrogen, which reacts with the material after it is sputtered from the target, resulting in the deposited material being the product of the reaction, such as an oxide or nitride.

Chemical vapor deposition (CVD) is another type of thin film deposition, where the film is formed by a chemical reaction. The substrate is exposed to a mixture of gases, which reacts with the substrate surface to produce the desired deposit, which condenses on the substrate. CVD can be performed at medium to high temperature in a furnace, or in a CVD reactor in which the substrate is heated. Unwanted byproducts are usually also produced in the reaction, which are removed by gas flow through the reaction chamber. Plasma may be used to enhance the rates of chemical reaction. Metal-organic chemical vapor deposition (MOCVD) involves organo-metallic compounds as the reactants.

Ion implantation involves implanting ions of a first material in a second target material. The ions are electrostatically accelerated to a high energy, before impinging on the target material, such as on the surface of a substrate. The amount of material implanted, known as the dose, is the integral over time of the ion current. By controlling the dose and the energy, along with the applied temperature of the target, it is possible to change the crystal structure of the target surface in such a way that an amorphous layer is formed. The impinging ions break chemical bonds within the target material, and form new bonds which are unorganized and not in thermodynamic equilibrium, resulting in the target material becoming amorphous.

U.S. Pat. No. 5,976,398 to Yagi, entitled "Process for manufacturing semiconductor, apparatus for manufacturing semiconductor, and amorphous material", is directed to an amorphous nitride III-V compound semiconductor, and an apparatus and process for its manufacture. The manufacturing process utilizes plasma-enhanced MOCVD. The semiconductor manufacturing apparatus includes a reactor, a first and second activation-supply portions, an exhaust pipe, a heater, and a substrate holder. The substrate holder holds a substrate inside the reactor, which is allowed to form a vacuum. Each activation-supply portion is composed of a pair of gas introducing pipes, a quartz pipe connected with the reactor, and a microwave waveguide (or alternatively, a radio frequency coil) for providing activation.

Plasma of a V group element (e.g., nitrogen plasma) is generated at the first activation-supply portion and introduced into the reactor. For example, $N_2$ gas is introduced from the gas introducing pipe, and a microwave oscillator supplies microwaves to the microwave waveguide, which induces a discharge in the quartz pipe and activates the $N_2$ gas. A metal organic compound containing a III group element (e.g., Al, Ga, In) is supplied by a gas introducing pipe of the first activation-supply portion. An auxiliary material (e.g., He, Ne, Ar, $H_2$, $Cl_2$, $Fl_2$) is supplied by the gas introducing pipe of the second activation-supply portion. The auxiliary material (e.g., hydrogen plasma) reacts with an organic functioning group of the metal organic compound, including the III group element, to inactivate the organic functional group. The vaporized metallic organic compound and the plasma of the auxiliary material is added to the plasma of the V group element.

The heater heats the substrate to the appropriate temperature (e.g., from 200° C. to 400° C.). A film of amorphous material, containing the III group element and the V group element, is formed on the substrate. The film of the semiconductor compound contains the III group element and the V group element. For example, the amorphous material is hydrogenated amorphous gallium nitride. The amorphous material is suitable as an optical semiconductor for optoelectronic applications.

US Patent Application Pub. No. US 2002/0100910 to Kordesch, entitled "Band gap engineering of amorphous Al—Ga—N alloys", is directed to an amorphous semiconductor alloy including aluminum and gallium, and a method for its production, which utilizes sputter deposition. A semiconductor substrate is positioned on an anode inside a reactive sputter deposition chamber. The sputter deposition chamber also includes a sputter target on a target cathode. The sputter deposition chamber is coupled with an RF source and a matching network. The sputter target contains aluminum and gallium (e.g., a single integrated target with both aluminum and gallium, a single target with an aluminum portion and a gallium portion, or discrete targets of aluminum and gallium). The sputter target may also contain indium. Nitrogen gas is introduced into the sputter deposition chamber. The sputter deposition chamber is operated to promote reaction of the aluminum and gallium of the sputter target with the nitrogen. The semiconductor substrate is maintained at a deposition temperature (e.g., between about 77K to about 300K), selected to ensure that the grown alloy is amorphous. The relative proportions of aluminum and gallium are selected such that the amorphous alloy will have a band gap between about 3 eV and about 6 eV. The amorphous alloy has the chemical formula: $Al_xGa_{1-x}N$. The amorphous alloy may be doped, such as with a rare earth luminescent center, for various photonics applications.

SUMMARY OF THE DISCLOSED TECHNIQUE

In accordance with the disclosed technique, there is thus provided a method for forming a group-III metal nitride material film attached to a substrate, the method including the procedures of subjecting the substrate to an ambient pressure of no greater than 0.01 Pa, and heating the substrate to a temperature of between approximately 500° C.-800° C. The method further includes the procedures of introducing a group III metal vapor to the surface of the substrate at a base pressure of at least 0.01 Pa, until a plurality of group III metal drops form on the surface, and introducing active nitrogen to the surface at a working pressure of between 0.05 Pa and 2.5 Pa, until group III metal nitride molecules form on the group III metal drops. The method also includes the procedures of maintaining the working pressure and the active nitrogen until the group III metal nitride molecules diffuse into the group III metal drops, forming nitride/metal solution drops, and until the nitride/metal solution drops turn into a wetting layer on the substrate, and continuing to increase the concentration of group III metal nitride molecules in the wetting layer until all the group III metal atoms contained in the wetting layer are exhausted, and the wetting layer transforms into a group III metal nitride film.

According to the disclosed technique, if the wetting layer is relatively thin, then group-III metal nitride molecules diffuse into the wetting layer, during the procedure of continuing to increase, thereby increasing the viscosity thereof, transforming the wetting layer into a solid amorphous group III metal nitride film.

If the wetting layer is relatively thick, then a crystalline seeding film is formed on the surface of the wetting layer, during the procedure of continuing to increase, and wherein the active nitrogen diffuses through the seeding film, reacting with group-III metal in the wetting layer, thereby further thickening the seeding film, transforming the wetting layer into a crystalline group III metal nitride film.

BRIEF DESCRIPTION OF THE DRAWINGS

The disclosed technique will be understood and appreciated more fully from the following detailed description taken in conjunction with the drawings in which.

DETAILED DESCRIPTION OF THE EMBODIMENTS

The disclosed technique overcomes the disadvantages of the prior art by providing a thin film of a crystalline or an amorphous group-III metal nitride and a method for its preparation. According to the disclosed technique, a wetting layer of GaN/Ga solution is formed by exposing Ga drops, grown on a substrate, to active nitrogen. The wetting layer is further exposed to active nitrogen, which reacts with the gallium atoms on the surface of the wetting layer, to form GaN molecules. Various types of films can be formed, according to the thickness of the wetting layer (e.g., an amorphous film or a crystalline film).

In a relatively thin wetting layer, on the order of up to 50 nm, the GaN molecules diffuse into the bulk of the solution, increasing its viscosity. Eventually, all the gallium atoms are used up in the reaction, and the wetting layer transforms into a solid amorphous GaN layer.

In a relatively thick wetting layer, on the order of between 500 nm-1 µm, a temperature or concentration gradient may be constituted along the thickness of the wetting layer, such that a crystalline seeding film is formed on the surface of the wetting layer. Active nitrogen diffuses through the seeding film and reacts with liquid gallium in the underlying wetting layer to further increase the thickness of the crystalline film. A crystalline film grows from the surface of the wetting layer, toward the surface of the substrate, through the wetting layer. The crystalline film grows from a micrometric liquid solution surface toward an arbitrary solid substrate, exhausting the liquid solution. As the crystalline film is grown from the wetting layer, it spontaneously attaches to the substrate, such that there in no need for additional bonding of the crystal film to the substrate.

According to the disclosed technique, the crystal film is not affected by any crystalline mismatch or defect of a solid substrate, and the crystalline microstructure of the crystal film can be engineered to the specific task, by choosing the appropriate temperature for forming the seeding film. Being of micrometric thickness, the crystal film can be used by all solid state thin film technologies to build devices thereon. At the same time, the crystal film is supported by an arbitrary low-cost solid substrate, which does not present any substantial size limitation on the crystal layer.

Figure 1:
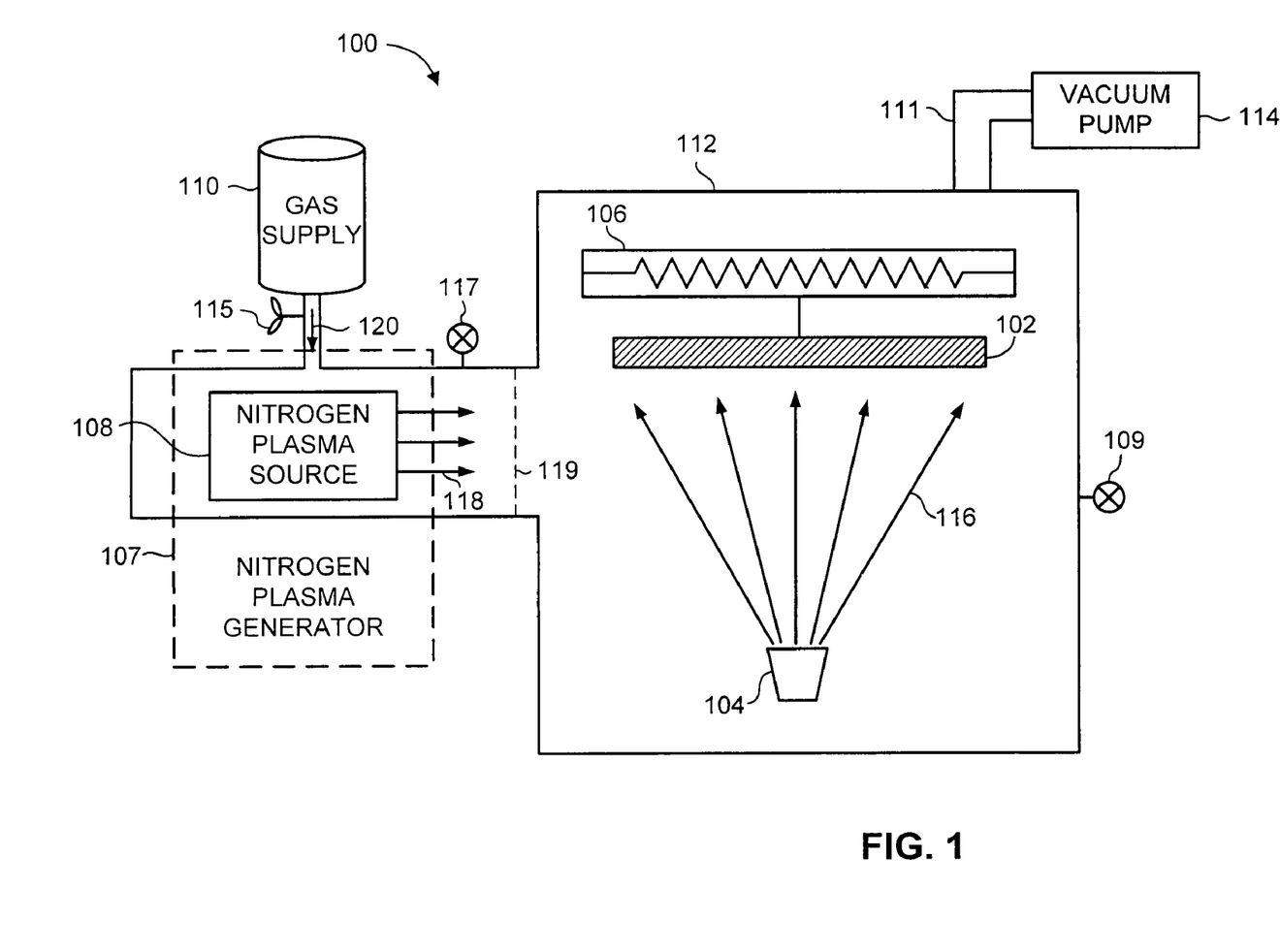
FIG. 1 is a schematic illustration of a system for gallium nitride material formation, constructed and operative in accordance with an embodiment of the disclosed technique.

Reference is now made to FIG. 1, which is a schematic illustration of a system, generally referenced 100, for gallium nitride formation, constructed and operative in accordance with an embodiment of the disclosed technique. System 100 includes a substrate 102, a heater 106, a gallium vapor source 104, a nitrogen plasma generator 107, a nitrogen gas supply 110, a nitrogen plasma source 108, a vacuum chamber 112 and a vacuum pump 114.

Vacuum pump 114 is coupled with vacuum chamber 112, via vacuum pipe 111. Substrate 102 is disposed inside vacuum chamber 112. Substrate 102 may be, for example, a silicon wafer. Gallium vapor source 104 is disposed inside vacuum chamber 112, opposite to the lower surface of substrate 102, such that gallium vapors 116 are directed from gallium vapor source 104 toward the lower surface of substrate 102. Heater 106 is coupled to the upper surface of substrate 102. In the configuration of system 100 depicted in FIG. 1, the lower surface of substrate 102 is the active surface, whereas the upper surface of substrate 102 is the non-active surface.

Nitrogen gas supply 110 is coupled with nitrogen plasma source 108. For example, nitrogen gas supply 110 is a cylinder of nitrogen gas ($N_2$), which is connected by a pipe to nitrogen plasma source 108. The pipe includes a leak valve 115 for regulating the pressure of the nitrogen gas in nitrogen plasma source 108. A pressure gauge 117 is coupled with nitrogen plasma generator 108, for monitoring the pressure therein.

Nitrogen plasma source 108 is located at one side of vacuum chamber 112, in proximity to the active surface of substrate 102. Nitrogen plasma generator 107 is located around nitrogen plasma source 108. Nitrogen plasma generator 107 may be, for example, a 100 kHz transformer type Plasmatron. Nitrogen plasma source 108 introduces active nitrogen (e.g., N or $N^+$) 118 to the reactor region of vacuum chamber 112 (i.e., where substrate 102 is located) via a shutter 119.

Nitrogen gas supply 110 directs pure nitrogen gas 120 to the interior of vacuum chamber 112. Using leak valve 115 and pressure gauge 117, the pressure of nitrogen gas 120 is set to approximately 5 Pascal (Pa). When a 100 kHz transformer type Plasmatron is employed, nitrogen plasma source 108 is operated at 100 kHz, and nitrogen gas 120 is ignited to produce active nitrogen 118. After shutter 119 is opened, active nitrogen 118 expands toward and comes in contact with the active surface of substrate 102.

It is noted that while the present description of the disclosed technique relates to the formation of a crystal layer or an amorphous gallium nitride (GaN) material, the disclosed technique may be similarly applied to the formation of a crystal layer or an amorphous material made up of other group-III metal nitrides, such as indium nitride (InN) or aluminum nitride (AlN). Accordingly, gallium may be replaced with indium or aluminum in the following description, and the disclosed technique is equally applicable, with any required adaptations, to the use of indium or aluminum rather than gallium.

Figure 2A:
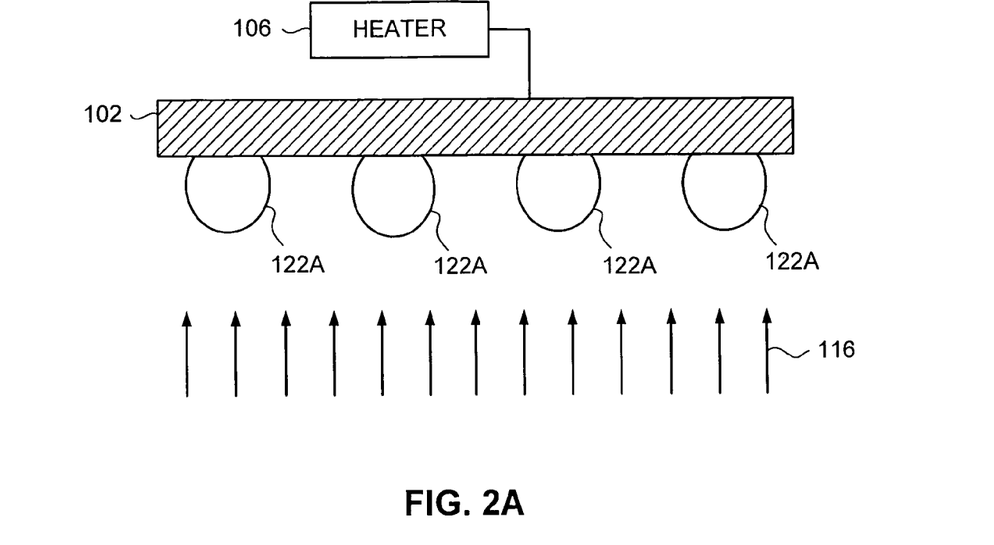
FIG. 2A is a schematic illustration of the substrate of the system of FIG. 1, at the stage when gallium drops are formed on the substrate, in accordance with another embodiment of the disclosed technique.
Figure 2B:
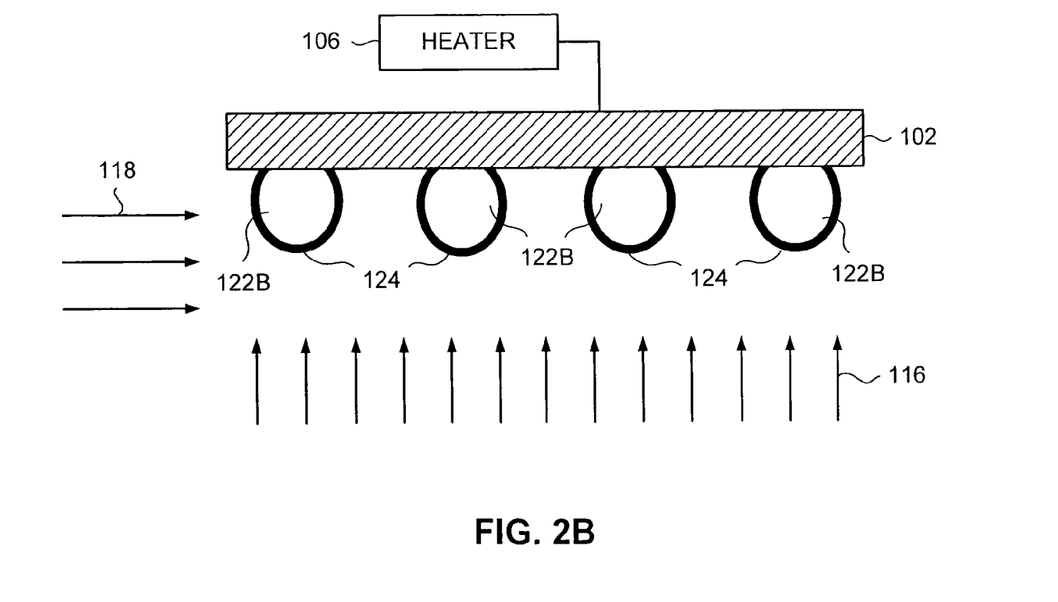
FIG. 2B is a schematic illustration of the substrate of FIG. 2A at a further stage, when GaN molecules are formed on the gallium drops.
Figure 2C:
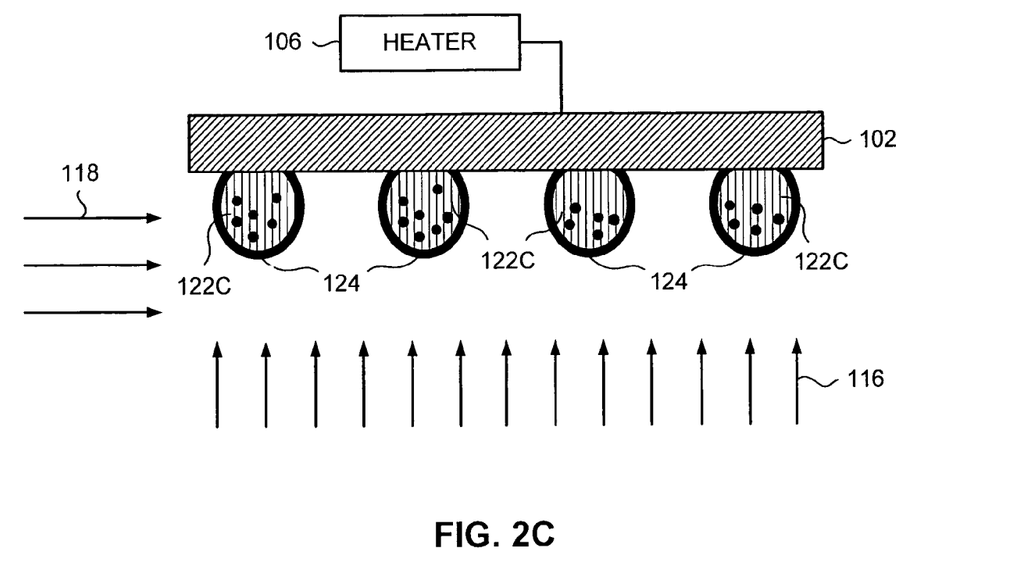
FIG. 2C is a schematic illustration of the substrate of FIG. 2B at a further stage, when the GaN molecules diffuse into the gallium drops, forming GaN/Ga solution drops.
Figure 2D:
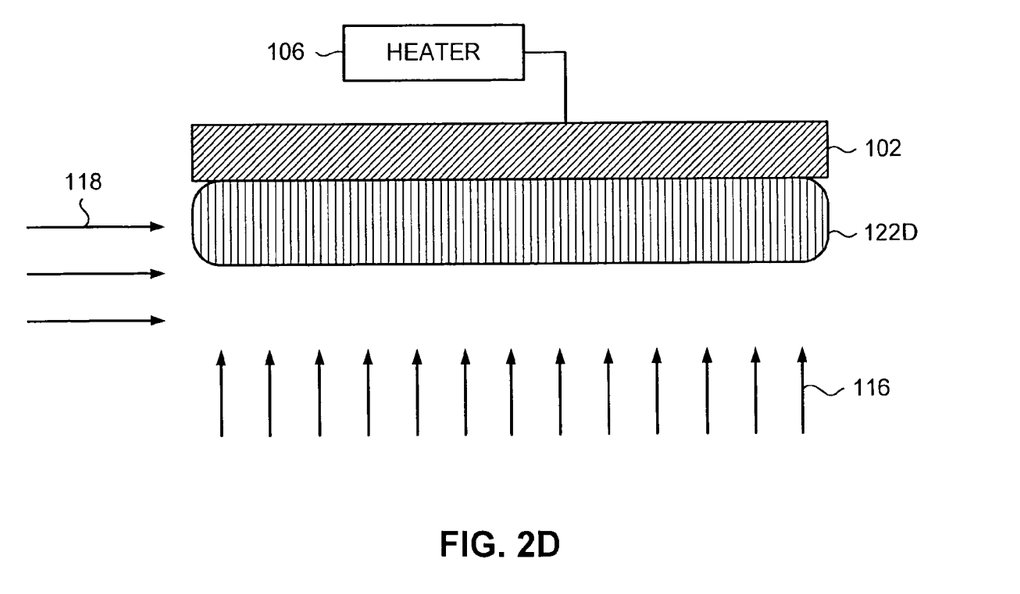
FIG. 2D is a schematic illustration of the substrate of FIG. 2C at a further stage, when the GaN/Ga solution drops transform into a wetting layer.
Figure 2E:
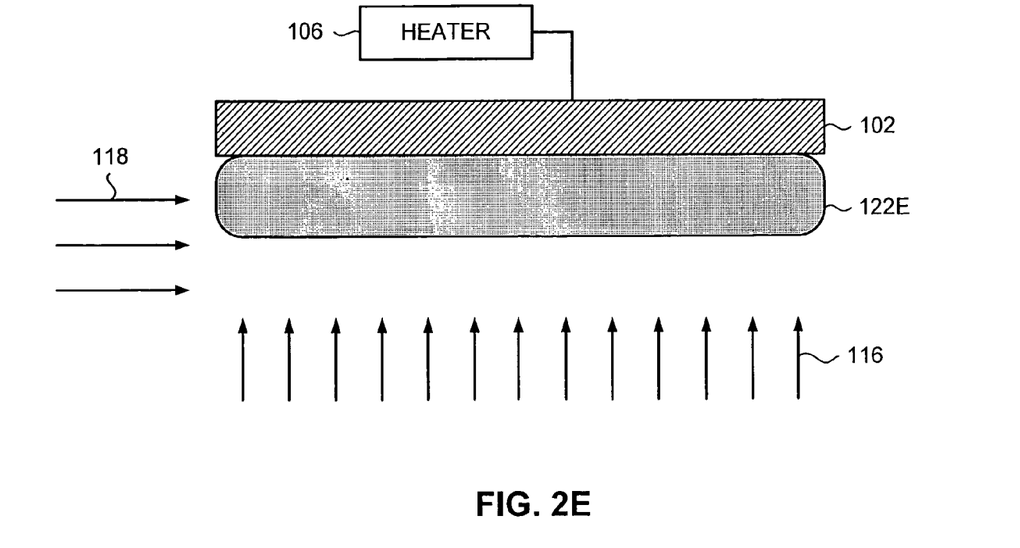
FIG. 2E is a schematic illustration of the substrate of FIG. 2D at a further stage, when the wetting layer transforms into a GaN crystal layer or an amorphous GaN layer.
Figure 2F:
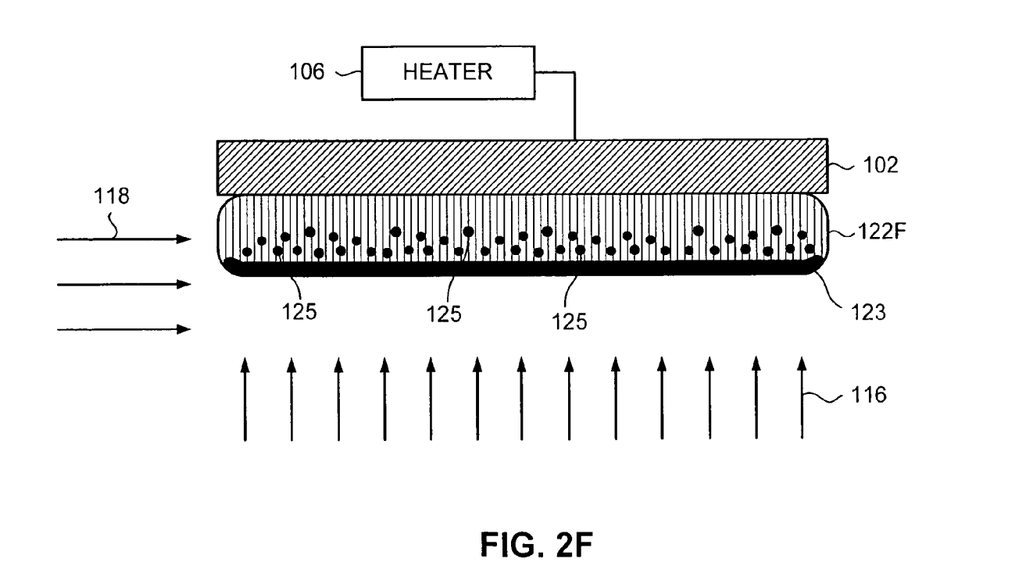
FIG. 2F is a schematic illustration of the substrate of FIG. 2D at a further stage, when a crystalline seeding film is formed on the wetting layer.
Figure 2G:
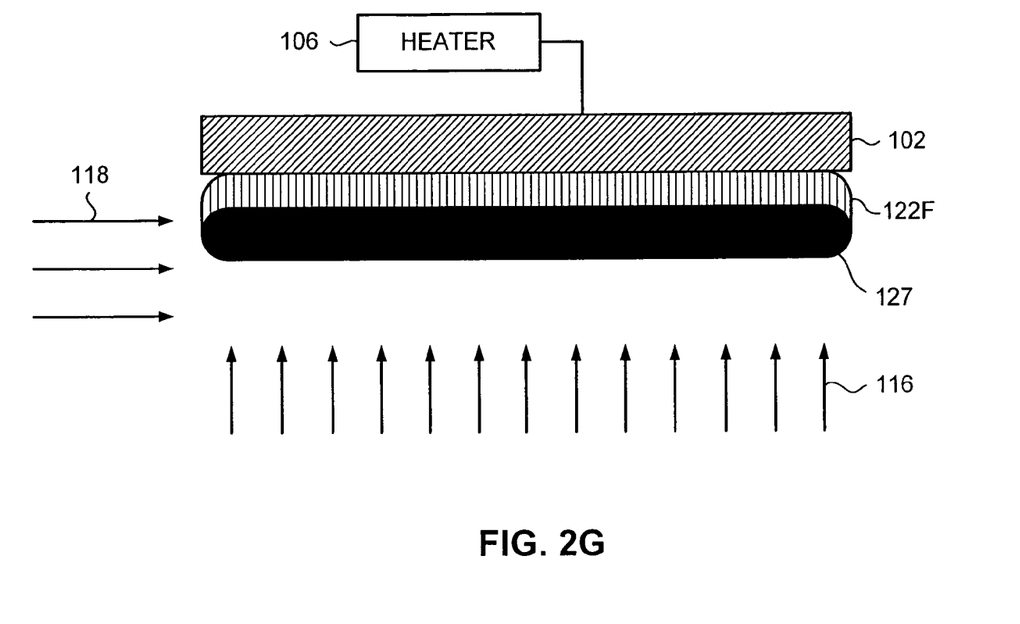
FIG. 2G is a schematic illustration of the substrate of FIG. 2F at a further stage, when the crystalline seeding film is thickened toward the substrate.

Reference is now made to FIGS. 2A, 2B, 2C, 2D, 2E, 2F and 2G. FIG. 2A is a schematic illustration of the substrate of the system of FIG. 1, at the stage when gallium drops are formed on the substrate, in accordance with another embodiment of the disclosed technique. FIG. 2B is a schematic illustration of the substrate of FIG. 2A at a further stage, when GaN molecules are formed on the gallium drops. FIG. 2C is a schematic illustration of the substrate of FIG. 2B at a further stage, when the GaN molecules diffuse into the gallium drops, forming GaN/Ga solution drops. FIG. 2D is a schematic illustration of the substrate of FIG. 2C at a further stage, when the GaN/Ga solution drops transform into a wetting layer. FIG. 2E is a schematic illustration of the substrate of FIG. 2D at a further stage, when the wetting layer transforms into a solid amorphous GaN layer. FIG. 2F is a schematic illustration of the substrate of FIG. 2D at a further stage, when a crystalline seeding film is formed on the wetting layer. FIG. 2G is a schematic illustration of the substrate of FIG. 2F at a further stage, when the crystalline seeding film is thickened toward the substrate.

With reference to FIG. 2A, heater 106 heats substrate 102 to a temperature higher than the melting point of gallium, for example, a temperature of between approximately 500° C.-800° C. It is noted that if indium is used rather than gallium, then the required temperatures would be lower by approximately 250° C., while if aluminum is used, then the required temperature would be somewhat higher than 500° C.

Gallium vapor source 104 (not shown) emits gallium vapors 116 toward the active surface of substrate 102. Vacuum pump 114 is employed to bring the base pressure inside vacuum chamber to at least 0.01 Pa. Gallium vapors 116 reach the active surface of substrate 102, and condense into gallium liquid drops 122A. Gallium liquid drops 122A include gallium atoms. The tendency of gallium drops 122A to remain substantially spherical or to spread easier depends on the composition of substrate 102, which determines the repelling or attracting interaction with the surface tension of gallium drops 122A. The precise size and quantity of gallium drops 122A depends, in addition to surface tension forces, on the pressure applied within vacuum chamber 112 (FIG. 1), on the temperature of substrate 102, and on the vapor pressure of gallium vapors 116.

Gallium drops 122A may condense in a uniform manner, such that each of gallium drops 122A is substantially the same size as other gallium drops 122A, and is separated by substantially the same distance from other gallium drops 122A. Alternatively, gallium drops 122A may condense in a non-uniform manner, such that each of gallium drops 122A is of different size, and is separated by varying distance from other gallium drops 122A. The uniformity of the size of gallium drops 122A and of the distance between gallium drops 122A depends on the uniformity of the active surface of substrate 102 and the presence of contaminants and defects. Therefore, the active surface of substrate 102 may be pre-treated to clean the surface of any contaminants, in order for gallium drops 122A to condense in a uniform manner. For example, the active surface of substrate 102 may be pre-treated by the application of active nitrogen, or by heating substrate 102 to a sufficiently high temperature (e.g., 850° C.), or a combination of both.

With reference to FIG. 2B, after the condensation of gallium drops 122A, nitrogen plasma generator 108 directs active nitrogen 118 toward the active surface of substrate 102. Active nitrogen 118 reacts with the gallium atoms of gallium drops 122B, resulting in the formation of GaN molecules 124 on the outer shell of gallium drops 122B. GaN molecules 124 are formed in accordance with the chemical reaction: Ga+N→GaN. GaN molecules 124 may include a single molecule or a cluster of molecules on the outer shell of each of gallium drops 122B, in accordance with the chemical reaction: $nGa+nN \rightarrow (GaN)_n$.

With reference to FIG. 2C, after GaN molecules 124 form on the outer shell of gallium drops 122B, GaN molecules 124 begin to diffuse into the liquid gallium inside gallium drops 122B. The inner liquid of gallium drops 122B is gradually converted into a GaN/Ga solution (i.e., GaN dissolved in liquid Ga), and gallium drops 122B transform into GaN/Ga solution drops 122C. The condition for crystallization is also referred to as critical saturation (CS). When homo-nucleation is employed, a higher value of CS is required, whereas when heteronucleation is employed, a lower value of CS is required. The term "homo-nucleation", as used herein, refers to the formation of crystalline grains on the surface of a liquid (i.e., on the interface between liquid and gas). The term "hetero-nucleation", as used herein, refers to the formation of crystalline grains on the surface of a solid substrate (i.e., at the interface between solid and liquid). Thus, nucleation of GaN may begin either on the surface of GaN/Ga solution drops 122C, or on the interface of GaN/Ga solution drops 122C and substrate 102, depending on the local concentration of GaN in Ga.

Wetting is a physical phenomenon relating to the contact between a fluid material and a solid surface. When a liquid has a high surface tension, it will form droplets (similar to gallium drops 122A), whereas a liquid with low surface tension will spread out over a greater area. Wetting is the result of the minimization of interfacial energy. If a fluid conforms to the surface of a substrate and its thickness-to-area ratio is minimal, then the fluid is considered a wetting fluid. A fluid that does not conform to the surface of a substrate and forms droplets is considered a non-wetting fluid.

The wetting characteristic of a fluid with respect to a substrate is dependent on their chemical properties. Altering the chemical properties of a fluid may change its wetting characteristic relative to the substrate. On the one hand, gallium is considered to be non-wetting, relative to a silicon substrate, and will therefore form drops on a silicon substrate. On the other hand, a GaN/Ga solution having a certain concentration is considered to be wetting, relative to a silicon substrate.

With reference to FIG. 2D, as the relative concentration of GaN/Ga increases in GaN/Ga solution drops 122C, the surface tension of GaN/Ga solution drops 122C decreases. Since GaN/Ga solution is wetting relative to substrate 102, GaN/Ga solution drops 122C eventually spread and turn into a uniform wetting layer 122D, which covers the entire surface of substrate 102. As GaN/Ga solution drops 122C turn into wetting layer 122D, the thickness-to-area ratio of GaN/Ga solution drops 122C decreases by an order of magnitude. The size of the liquid drops determines the rate at which the wetting layer is formed. If the drops are relatively small, then the drops will reach the required concentration for spreading after a short time. If the drops are relatively large, then the drops will reach the required concentration for spreading after a longer time. In the case where a combination of both large drops and small drops are formed on substrate 102, then the small drops will spread almost instantly when active nitrogen 118 is first introduced, whereas the large drops will remain unspread. With further exposure to active nitrogen, the wetting layer formed by the small drops will begin to solidify and eventually convert into an amorphous layer, while the large drops are only beginning to spread. The eventual undesirable result is large drops spread on the existing an amorphous layer. Therefore, it is important that the size of GaN/Ga solution drops 122C be substantially uniform. In particular, the difference in the diameter of GaN/Ga solution drops 122C must not exceed a factor of 2. This is achieved by appropriate selection of the type of substrate 102, the cleanliness of substrate 102, the temperature of substrate 102, the introduction rate of gallium vapors 116, as well as the vacuum pressure. It is noted, that system 100 of FIG. 1 may further include a meter (not shown) for measuring the thickness of the wetting layer formed on substrate 102.

With reference to FIG. 2E, nitrogen plasma generator 108 (FIG. 1) continues to direct active nitrogen 118 toward wetting layer 122D. When wetting layer 122D is a relatively thin layer, on the order of 50 nm, an amorphous layer is formed. Active nitrogen 118 reacts with the gallium atoms on the surface of wetting layer 122D, forming new GaN molecules (i.e., according to the equation: Ga+N→GaN). The GaN molecules diffuse into the bulk of the GaN/Ga solution, increasing its level of viscosity. The reaction gradually uses up more and more gallium atoms, producing a greater amount of GaN molecules, which further increase the viscosity of the solution. After a sufficient duration, all the gallium has been exhausted and wetting layer 122D has transformed into a highly viscous film with a solid-like form, which is an amorphous layer 122E. It is noted, that at this stage, the temperature of substrate 102 may be brought to a temperature between approximately 200° C.-600° C., to allow formation of amorphous layer 122E. Since wetting layer 122E is relatively thin, the temperature therein is uniform, and the chemical process occurring therein is also uniform.

In another embodiment of the disclosed technique, the amorphous GaN layer is formed by continually heating the wetting layer for a longer period after nitridation, such that the gallium atoms remaining in the solution are evaporated, rather than by introducing additional active nitrogen to react with the gallium atoms.

It has been found experimentally that an amorphous gallium nitride having a thickness of approximately 50 nm (i.e., in a single layer) can be fabricated in accordance with the disclosed technique.

With reference to FIGS. 2F and 2G, nitrogen plasma generator 108 (FIG. 1) continues to direct active nitrogen 118 toward wetting layer 122D. When wetting layer 122D is a thick layer, on the order of between 500 nm-1 μm, a crystalline film is formed. It is noted, that at this stage, the temperature of substrate 102 may be brought to a temperature approximately 900° C. Since wetting layer 122F is relatively thick, a temperature gradient is formed along the thickness thereof (i.e., higher temperature near the surface of substrate 102), as well as a concentration gradient (i.e., lower GaN/Ga concentration near the surface of substrate 102). A GaN crystal seeding film 123 forms on top of wetting layer 122F, as a result of the temperature and concentration gradients therein. Since GaN crystal layer 123 crystallizes spontaneously on a liquid surface of the wetting layer, it is prone to crystallize with substantially no defects originating from substrate 102, such as dislocations existing in substrate 102 or misfit dislocations originating from differences in lattice parameters between GaN crystal layer 122 and substrate 102 (which may constitute of a different material).

Nitrogen atoms 125 from nitrogen plasma 118 diffuse through seeding film 123 and couple with gallium atoms within the underlying wetting layer 122F. Thus, a plurality of new GaN molecules is formed in wetting layer 122F, thereby thickening seeding film 123 into wetting layer 122F. As nitrogen plasma 118 is maintained, seeding film 123 grows further into wetting layer 122F, turning into crystal film 127 (FIG. 2G). This may continue until the entire liquid content of wetting layer 122F is fully crystallized (i.e., the solution is exhausted by seeding film 123), and a GaN crystal film is formed, having the approximate thickness of wetting layer 122F. Once the solution of wetting layer 122F is exhausted, the formed GaN crystal film 127 reaches the active surface of substrate 102 and spontaneously attaches thereto. In this manner, the disclosed technique allows the formation of a GaN crystal film, which spontaneously attaches to a substrate, without the need for additional bonding of the crystal to the substrate.

Prior to the formation of GaN film (wither amorphous or crystalline), the wetting layer may be thickened by adding more gallium. The wetting layer may also be doped, at the thickening stage and before the nitridation stage (the reaction of active nitrogen with gallium to form gallium nitride), resulting in a GaN film containing dopants. An example is the p-type magnesium doping group-III metal nitride.

Additional layers may be formed on top of the crystalline or amorphous GaN film, where the previous formed layer acts as a substrate for subsequent layers. For example, a series of thin layers may be formed in succession, thereby producing a thicker layer. The thin layers may alternate between different group-III metal nitrides (e.g., AlN—GaN—AlN, etc). A crystal layer of GaN crystal may also be grown on the amorphous layer. It is noted that amorphous layers are excellent buffers for thermal deformation of different crystalline phases.

By annealing adjacent amorphous layers of different group-III metal nitrides, a group-III metal nitride alloy may be formed, such as a layer containing both gallium and aluminum nitride (i.e., having the formula $Al_xGa_yN$). It is noted that alternating layers can produce quantum wells, whereas various annealing/cooling schemes can produce quantum dots and micro-crystals.

It is noted that the concentration of active nitrogen 118 must reach a point beyond saturation, for example twice as high as the concentration required for crystallization to occur (i.e., at the temperature of 500° C.). Furthermore, the active nitrogen must be applied for a sufficiently long time. During experimental proceedings, it was found that a period of 120 seconds resulted in the formation of amorphous GaN, whereas shorter periods of 90 seconds or 75 seconds resulted in the formation of a GaN crystal layer on top of the wetting layer (i.e., where the crystal is grown by cooling). Crystallization may occur if a non-saturated solution is allowed to cool.

Figure 3:
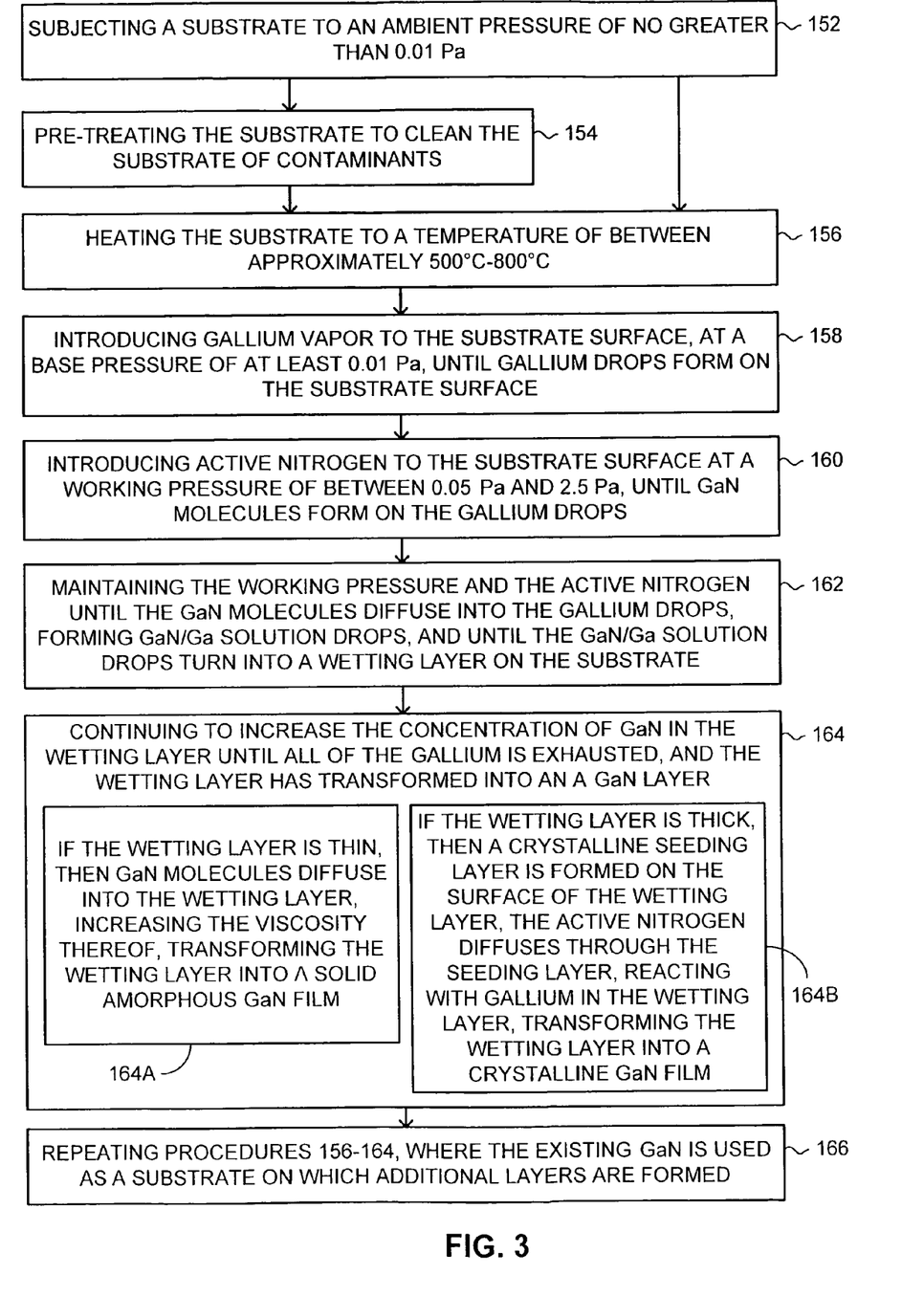
FIG. 3 is a schematic illustration of a method for gallium nitride formation, operative in accordance with a further embodiment of the disclosed technique.

Reference is now made to FIG. 3, which is a schematic illustration of a method for gallium nitride formation, operative in accordance with a further embodiment of the disclosed technique. In procedure 152, the substrate is subjected to an ambient pressure of no greater than 0.01 Pa. With reference to FIG. 1, substrate 102 is placed inside vacuum chamber 112. The pressure inside vacuum chamber 112 is brought to a pressure of no greater than 0.01 Pa, by pumping out the gas inside vacuum chamber 112 using vacuum pump 114.

In procedure 154, the substrate is pre-treated, in order to clean the substrate of any contaminants that may be present. It is noted that procedure 154 is optional, and that the method depicted in FIG. 3 may proceed directly from procedure 152 to procedure 156. With reference to FIG. 1, substrate 102 is pre-treated to dispose of possible contaminants. Removal of contaminants may be carried out by heating, or by other means.

In procedure 156, the substrate is heated to a temperature of between approximately 500° C.-800° C. With reference to FIG. 2A, heater 106 heats substrate 102 to a temperature higher than the melting point of gallium, for example, a temperature of between approximately 500° C.-800° C. If an amorphous material GaN layer is to be formed, heater 106 heats substrate 102 to a temperature of approximately 500° C. If a GaN crystal layer is to be formed, then heater 106 heats substrate 102 to a temperature of approximately 800° C.

In procedure 158, gallium vapor is introduced to the substrate surface at a base pressure of at least 0.01 Pa, until gallium drops form on the substrate surface. This pressure is suitable for gallium drop formation, since a higher base pressure would contain oxygen, which is undesirable. With reference to FIGS. 1 and 2A, gallium vapor source 104 emits gallium vapor 116 toward the active surface of substrate 102, until gallium liquid drops 122A are formed on substrate 102. Vacuum pump 114 is employed to apply a pressure inside vacuum chamber 112 of at least 0.01 Pa. It is suggested that the gallium vapor be introduced at a base pressure of at least 0.01 Pa, although a higher pressure might be employed (i.e., by adding a noble gas or pure nitrogen).

In procedure 160, active nitrogen is introduced to the substrate surface, at a sub-atmospheric pressure selected from the range of between approximately 0.05 Pa and approximately 2.5 Pa, until GaN molecules form on the gallium drops. This sub-atmospheric pressure is also referred to as the "working pressure". As the nitrogen plasma is introduced to the gallium drops, the active nitrogen reacts with the gallium atoms on the outer shell of gallium drops, thereby resulting in the formation of GaN molecules on the gallium drops. It is noted that gallium vapor 116 may continue to be emitted during procedure 160. With reference to FIGS. 1 and 2B, nitrogen gas source 110 directs pure nitrogen gas 120 toward nitrogen plasma generator 108. Nitrogen plasma generator 108 ignites pure nitrogen gas 120 into active nitrogen 118 (N or $N^+$). Nitrogen plasma generator 108 directs active nitrogen plasma 118 toward the active surface of substrate 102. Active nitrogen 118 reacts with the gallium atoms on the outer shell of gallium drops 122B, resulting in the formation of GaN molecules 124 on gallium drops 122B.

In procedure 162, the working pressure around the substrate and the directed stream of active nitrogen are maintained, until the GaN molecules diffuse into the gallium drops, forming GaN/Ga solution drops, and until the GaN/Ga solution drops turn into a wetting layer on the substrate. It is noted that gallium vapor 116 may continue to be emitted during procedure 162. With reference to FIGS. 1, 2C and 2D, active nitrogen 118 is kept directed toward the active surface of substrate 102, until GaN molecules 124 begin to diffuse into the liquid gallium inside gallium drops 122B, eventually forming GaN/Ga solution drops 122C. The working pressure is maintained around substrate 102. Active nitrogen 118 is maintained, until the surface tension of GaN/Ga solution drops 122C decreases. GaN/Ga solution drops 122C turn into uniform wetting layer 122D, covering the active surface of substrate 102.

In procedure 164, the concentration of GaN in the wetting layer continues to be increased, until all of the gallium is exhausted, and the wetting layer has transformed into a GaN crystal layer or an amorphous GaN layer. The concentration of GaN in the wetting layer may be increased by maintaining the directed stream of active nitrogen, allowing the active nitrogen to react with the gallium atoms on the surface of the wetting layer. Alternatively, the increase in concentration of GaN is achieved by heating the substrate to evaporate the remaining gallium atoms. Various types of films can be formed, according to the thickness of the wetting layer (e.g., an amorphous film or a crystalline film). In sub-procedure 164A, if the wetting layer is relatively thin (e.g., 50 nm), then GaN molecules diffuse into the wetting layer, increasing the viscosity thereof, transforming the wetting layer into a solid amorphous GaN film. In sub-procedure 164B, if the wetting layer is relatively thick (e.g., 500 nm), then a crystalline seeding film is formed on the surface of the wetting layer, the active nitrogen diffuses through the seeding film, reacting with gallium in the wetting layer, transforming the wetting layer into a crystalline GaN film.

With reference to FIGS. 1 and 2E, active nitrogen 118 is kept directed toward wetting layer 122D. The gallium atoms on the surface of wetting layer 122D react with active nitrogen 118, forming new GaN molecules, which diffuse into the bulk of the solution, increasing its level of viscosity. Eventually all the gallium is exhausted, and wetting layer 122D has transformed into solid GaN amorphous layer 122E.

With reference to FIGS. 1, 2F and 2G, nitrogen plasma generator 108 continues to direct active nitrogen 118 toward wetting layer 122D. A GaN crystal seeding film 123 forms on top of wetting layer 122F, as a result of the temperature and concentration gradients therein. Nitrogen atoms 125 from nitrogen plasma 118 diffuse through seeding film 123 and couple with gallium atoms within the underlying wetting layer 122F. Thus, a plurality of new GaN molecules is formed in wetting layer 122F, thereby thickening seeding film 123 into wetting layer 122F. As nitrogen plasma 118 is maintained, seeding film 123 grows further into wetting layer 122F, turning into crystal film 127. This may continue until the entire liquid content of wetting layer 122F is fully crystallized.

In procedure 166, procedures 156, 158, 160, 162 and 164 are repeated indefinitely, where the existing GaN layer is used as a substrate on which additional layers are formed. For example, a series of thin crystal or amorphous layers are formed in succession, to produce a thicker crystal or amorphous GaN layer. Alternatively, a GaN crystal layer may be grown on an amorphous layer. It is noted, that before additional layers are grown on the existing layer, the existing layer is to be cooled completely, prior to reheating thereof. Further alternatively, a group-III metal nitride alloy may be formed, by annealing adjacent amorphous layers.

It will be appreciated by persons skilled in the art that the disclosed technique is not limited to what has been particularly shown and described hereinabove. Rather the scope of the disclosed technique is defined only by the claims, which follow.

The invention claimed is:

1. Method for forming a group-III metal nitride film attached to a substrate, the method comprising the procedures of:

subjecting said substrate to an ambient pressure of no greater than 0.01 Pa;

heating said substrate to a temperature of between approximately 500° C.-800° C.;

introducing a group-III metal vapor to the surface of said substrate at a base pressure of at least 0.01 Pa, until a plurality of group-III metal drops form on said surface;

introducing active nitrogen to said surface at a working pressure of between 0.05 Pa and 2.5 Pa, until group-III metal nitride molecules form on said group-III metal drops;

maintaining said working pressure and said active nitrogen until said group-III metal nitride molecules diffuse into said group-III metal drops, forming nitride/metal solution drops, and until said nitride/metal solution drops turn into a wetting layer on said substrate; and continuing to increase the concentration of group-III metal nitride molecules in said wetting layer until all the group-III metal atoms contained in said wetting layer are exhausted, and said wetting layer transforms into a group-III metal nitride film.

2. The method according to claim 1, wherein if said wetting layer is relatively thin, then group-III metal nitride molecules diffuse into said wetting layer, during said procedure of continuing to increase, thereby increasing the viscosity thereof, transforming said wetting layer into a solid amorphous group-III metal nitride film.

3. The method according to claim 2, wherein the thickness of said wetting layer is of approximately 50 nm.

4. The method according to claim 2, wherein the temperature of said substrate is brought to a temperature of between approximately 200° C.-600° C., during said procedure of continuing to increase.

5. The method according to claim 4, wherein if the temperature of said substrate is brought to a temperature of approximately 200° C., then said solid amorphous group-III metal nitride film is a pure amorphous material.

6. The method according to claim 4, wherein if the temperature of said substrate is brought to a temperature of approximately 600° C., then said solid amorphous group-III metal nitride film includes nano-structures therein.

7. The method according to claim 1, wherein if said wetting layer is relatively thick, then a crystalline seeding film is formed on the surface of said wetting layer, during said procedure of continuing to increase, and wherein said active nitrogen diffuses through said seeding film, reacting with group-III metal in said wetting layer, thereby further thickening said seeding film, transforming said wetting layer into a crystalline group-III metal nitride film.

8. The method according to claim 7, wherein the thickness of said wetting layer is of approximately 500 nm.

9. The method according to claim 7, wherein the temperature of said substrate is brought to a temperature of approximately 900° C. during said procedure of continuing to increase.

10. The method according to claim 1, wherein said procedure of continuing to increase the concentration of group-III metal nitride molecules in said wetting layer is accomplished by maintaining said active nitrogen until all the group-III metal atoms contained in said wetting layer are exhausted.

11. The method according to claim 1, wherein said procedure of continuing to increase the concentration of group-III metal nitride molecules in said wetting layer is accomplished by further heating said wetting layer until all the group-III metal atoms remaining in said wetting layer are evaporated.

12. The method according to claim 1, wherein said group-III metal comprises at least one element selected from the list consisting of aluminum, gallium, and indium.

13. The method according to claim 1, further comprising the procedure of pre-treating said substrate to clean said substrate of contaminants.

14. The method according to claim 1, wherein dopants are added to said wetting layer prior to said procedure of continuing to increase the concentration of group-III metal nitride molecules in said wetting layer.

15. The method according to claim 1, further comprising the procedure of forming additional layers on said group-III metal nitride layer, using said group-III metal nitride layer as a substrate.

16. The method according to claim 15, wherein one of said additional layers is a group-III metal nitride crystal layer.

* * * * *